(12) United States Patent
Wang et al.

(10) Patent No.: US 12,062,598 B2
(45) Date of Patent: Aug. 13, 2024

(54) INTEGRATED CIRCUIT LEAD FRAME AND SEMICONDUCTOR DEVICE THEREOF

(71) Applicant: REALTEK SEMICONDUCTOR CORP., Hsinchu (TW)

(72) Inventors: Yu-Hsin Wang, Hsinchu (TW); Nai-Jen Hsuan, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 496 days.

(21) Appl. No.: 17/390,369

(22) Filed: Jul. 30, 2021

(65) Prior Publication Data
US 2022/0238419 A1 Jul. 28, 2022

(30) Foreign Application Priority Data

Jan. 28, 2021 (TW) ................................. 110103332

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3107* (2013.01); *H01L 23/4952* (2013.01); *H01L 24/48* (2013.01); *H01L 2224/48177* (2013.01)

(58) Field of Classification Search
CPC ........... H01L 23/49541; H01L 23/3107; H01L 23/4952; H01L 24/48
See application file for complete search history.

(56) References Cited

U.S. PATENT DOCUMENTS

| | | | |
|---|---|---|---|
| 6,538,336 B1 | 3/2003 | Secker et al. | |
| 7,884,451 B2 | 2/2011 | Sutardja | |
| 8,294,249 B2 | 10/2012 | Pilling et al. | |
| 2006/0186514 A1* | 8/2006 | Shim | H01L 23/49548 257/E25.023 |
| 2011/0157852 A1* | 6/2011 | Ikemoto | H05K 7/06 361/728 |

FOREIGN PATENT DOCUMENTS

CN 100382290 C 4/2008

* cited by examiner

*Primary Examiner* — Marc Anthony Armand
(74) *Attorney, Agent, or Firm* — Birch, Stewart, Kolasch & Birch, LLP

(57) ABSTRACT

An integrated circuit lead frame and a semiconductor device thereof are provided. The integrated circuit lead frame includes a die pad and a plurality of leads. The die pad is provided to attach a die. The plurality of leads are provided for connection to the die through wire bonding. The leads include a pair of a first lead and a second lead. The first lead includes a first body and a first extension portion connected to the first body. The second lead includes a second body and a second extension portion connected to the second body. The first extension portion and the second extension portion extend in directions toward each other.

20 Claims, 16 Drawing Sheets

US 12,062,598 B2

1

INTEGRATED CIRCUIT LEAD FRAME AND SEMICONDUCTOR DEVICE THEREOF

CROSS-REFERENCE TO RELATED APPLICATION

This non-provisional application claims priority under 35 U.S.C. § 119(a) to Patent Application No. 110103332 filed in Taiwan, R.O.C. on Jan. 28, 2021, the entire contents of which are hereby incorporated by reference.

BACKGROUND

Technical Field

The present invention relates to a lead frame, and in particular, to an integrated circuit lead frame for optimizing wire impedance matching and a semiconductor device thereof.

Related Art

In order to meet the requirements of high-speed transmission, most chips adopt packaging technologies such as a high-cost ball grid array (BGA), a flip chip, and the like, to shorten a distance between a die and a substrate and avoid signal attenuation caused by wire bonding without impedance control. Although the costs of traditional packaging technologies through wire bonding are lower than those of the above packaging technologies, it is difficult to provide high-speed signals due to uncontrollable electrical characteristics of the wire bonding.

SUMMARY

In view of the above, the present invention provides an integrated circuit lead frame and a semiconductor device, which optimizes impedance matching between wires in a package through the design of leads and the packaging technology of wire bonding, and greatly reduces the process cost and achieves high-density packaging with high speed pins, thereby improving performance and further reducing process costs.

According to some embodiments, the integrated circuit lead frame includes a die pad and a plurality of leads. The die pad is provided to attach a die. The plurality of leads are provided for connection to the die through wire bonding. The leads include a pair of a first lead and a second lead. The first lead includes a first body and a first extension portion connected to the first body. The second lead includes a second body and a second extension portion connected to the second body. The first extension portion and the second extension portion extend in directions toward each other.

According to some embodiments, the semiconductor device includes a die, an integrated circuit lead frame, and a package. The integrated circuit lead frame includes a die pad and a plurality of leads. The die pad is provided to attach a die. The plurality of leads are provided for connection to the die through wire bonding. The leads include a pair of a first lead and a second lead. The first lead includes a first body and a first extension portion connected to the first body. The second lead includes a second body and a second extension portion connected to the second body. The first extension portion and the second extension portion extend in directions toward each other. The package encapsulates the die and a part of the integrated circuit lead frame.

2

Based on the above, according to the embodiments of the present invention, by virtue of the shape design of the leads (for example, contacts of the pair of the two leads for connection through wire bonding extend in directions toward each other) and the packaging technology of wire bonding, the spacing between wires of the pair of the leads connected through wire bonding can be shortened to obtain good impedance matching, thereby providing high-speed signal transmission and reducing process costs.

DETAILED DESCRIPTION

Figure 1:
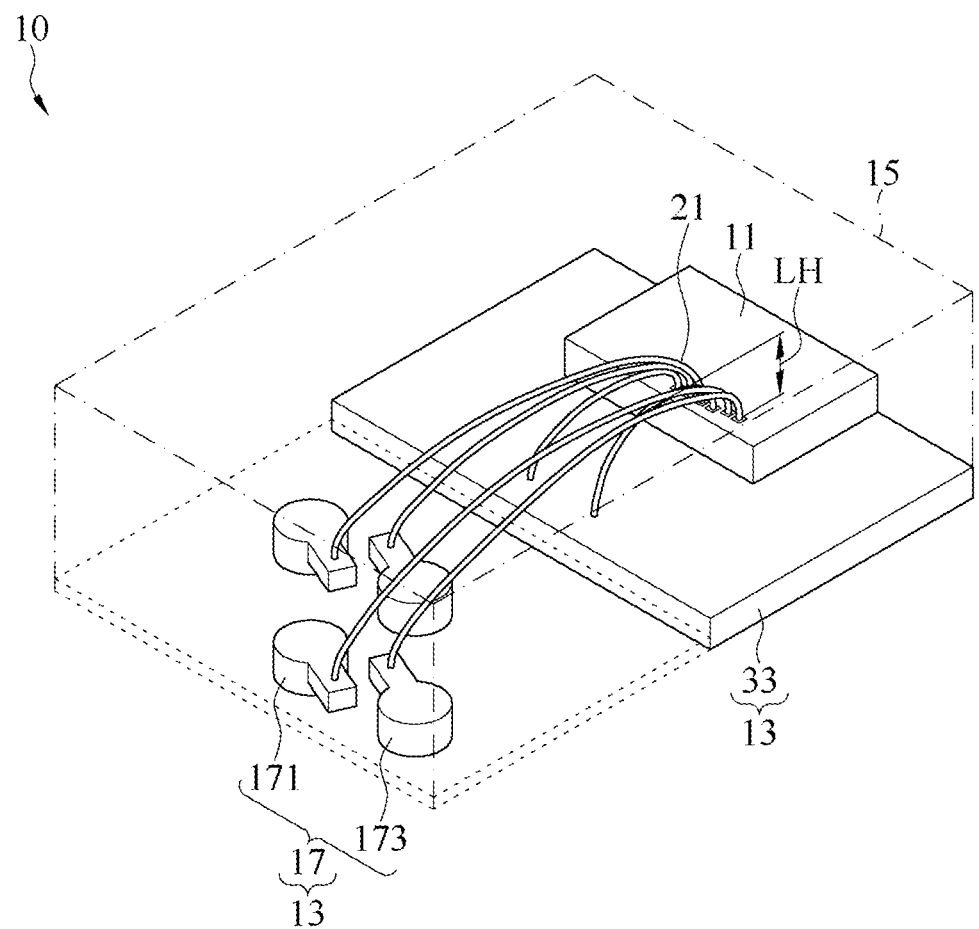
FIG. 1 is a three-dimensional perspective schematic diagram of a semiconductor device according to some embodiments of the present invention.

Referring to FIG. 1, FIG. 1 is a three-dimensional perspective schematic diagram of a semiconductor device 10 according to some embodiments of the present invention. The semiconductor device 10 includes a die 11, an integrated circuit lead frame 13, and a package 15. The die 11 is a die formed by cutting a wafer. The integrated circuit lead frame 13 is a metal structure inside the package of the semiconductor device 10. The integrated circuit lead frame 13 is configured to transmit a signal of the die 11 to outside of the semiconductor device 10 for a circuit outside the semiconductor device 10 (for example, a circuit board outside the semiconductor device 10) to receive the signal from the die 11 via the integrated circuit lead frame 13. The package 15 encapsulates the die 11 and a part of the integrated circuit lead frame 13. The package 15 provides certain impact and scratch protection for the die 11. For the convenience of description, the semiconductor device 10 includes only one die 11, for example, but the present invention is not limited thereto. The semiconductor device 10 may include a plurality of dies 11.

Figure 2:
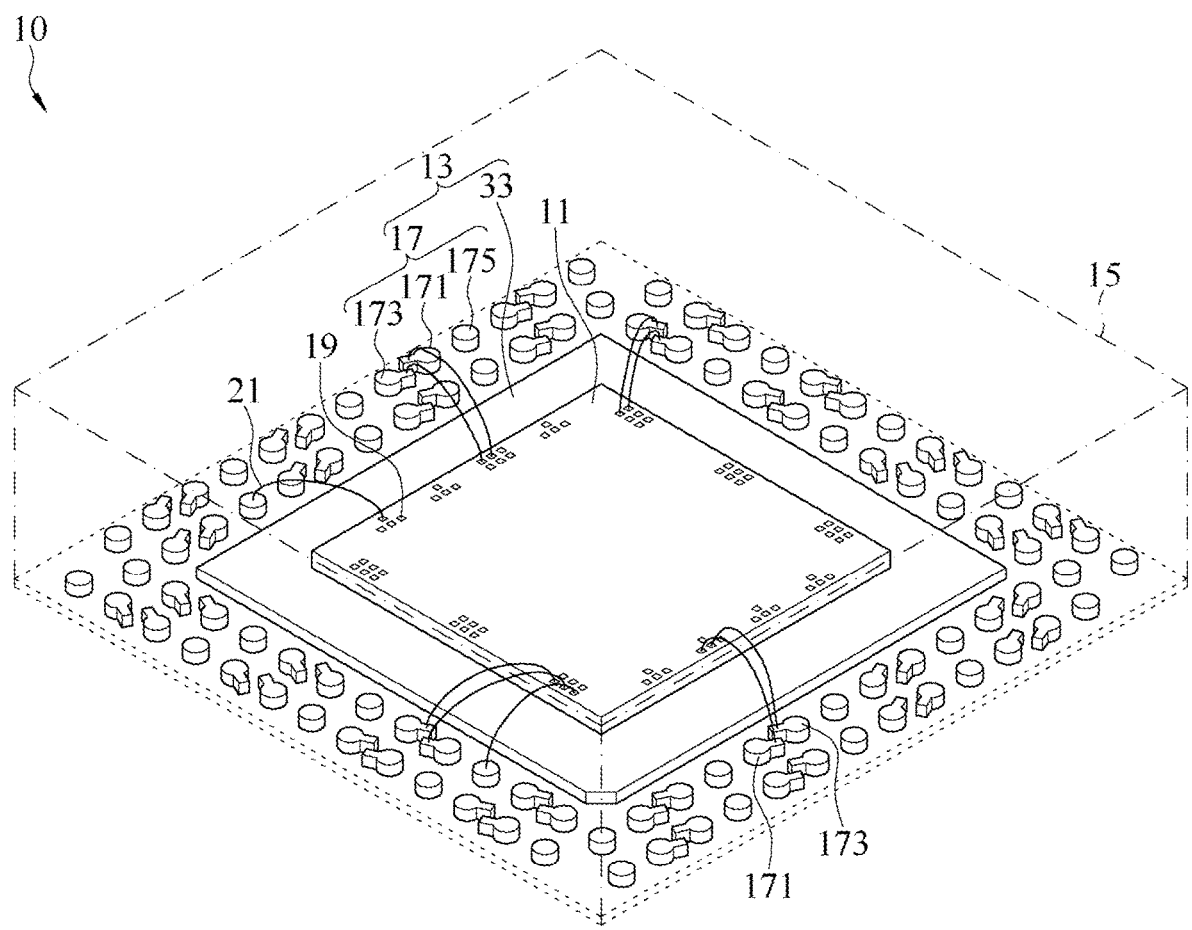
FIG. 2 is a perspective three-dimensional schematic diagram of the semiconductor device according to some embodiments of the present invention.
Figure 3:
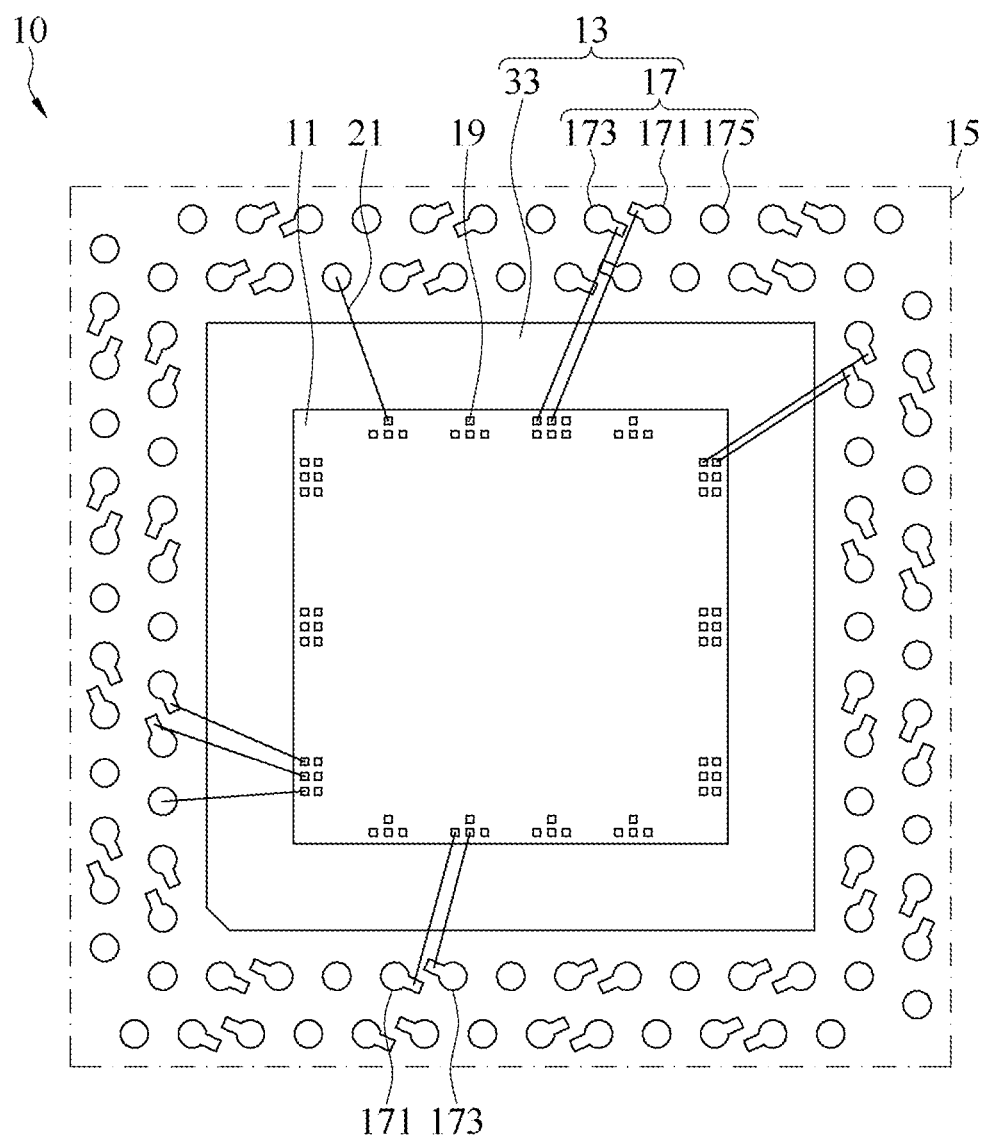
FIG. 3 is a schematic top view of FIG. 2.

Referring to FIG. 2 and FIG. 3, FIG. 2 is a perspective three-dimensional schematic diagram of the semiconductor device 10 according to some embodiments of the present invention. FIG. 3 is a schematic top view of FIG. 2. An integrated circuit lead frame 13 of the semiconductor device 10 includes a die pad 33 and a plurality of leads 17. The die pad 33 is provided to attach a die 11. For the convenience of description, only one die 11 is disposed on the die pad 33, for example, but the present invention is not limited thereto. The die pad 33 may be provided for disposing a plurality of dies 11, that is, the plurality of dies 11 may be simultaneously disposed on the die pad 33. In some embodiments, the die pad 33 is provided for the dies 11 to be adhered and fixed to the die pad 33 with epoxy (such as silver glue) or a die attach film, which is a die bonding process. The leads 17 are provided for connection to the die 11 through wire bonding. In other words, the leads 17 are connected to a pad 19 of the die 11 via a wire 21. In some embodiments, a material of the wire 21 is metals such as copper, gold, and the like. In some embodiments, if the material of the wire 21 is copper, a diameter of the wire 21 may be 0.7 mil to 1 mil. If the material of the wire 21 is gold, the diameter of the wire 21 may be 0.7 mil to 2 mil, but the present invention is not limited thereto.

Figure 4:
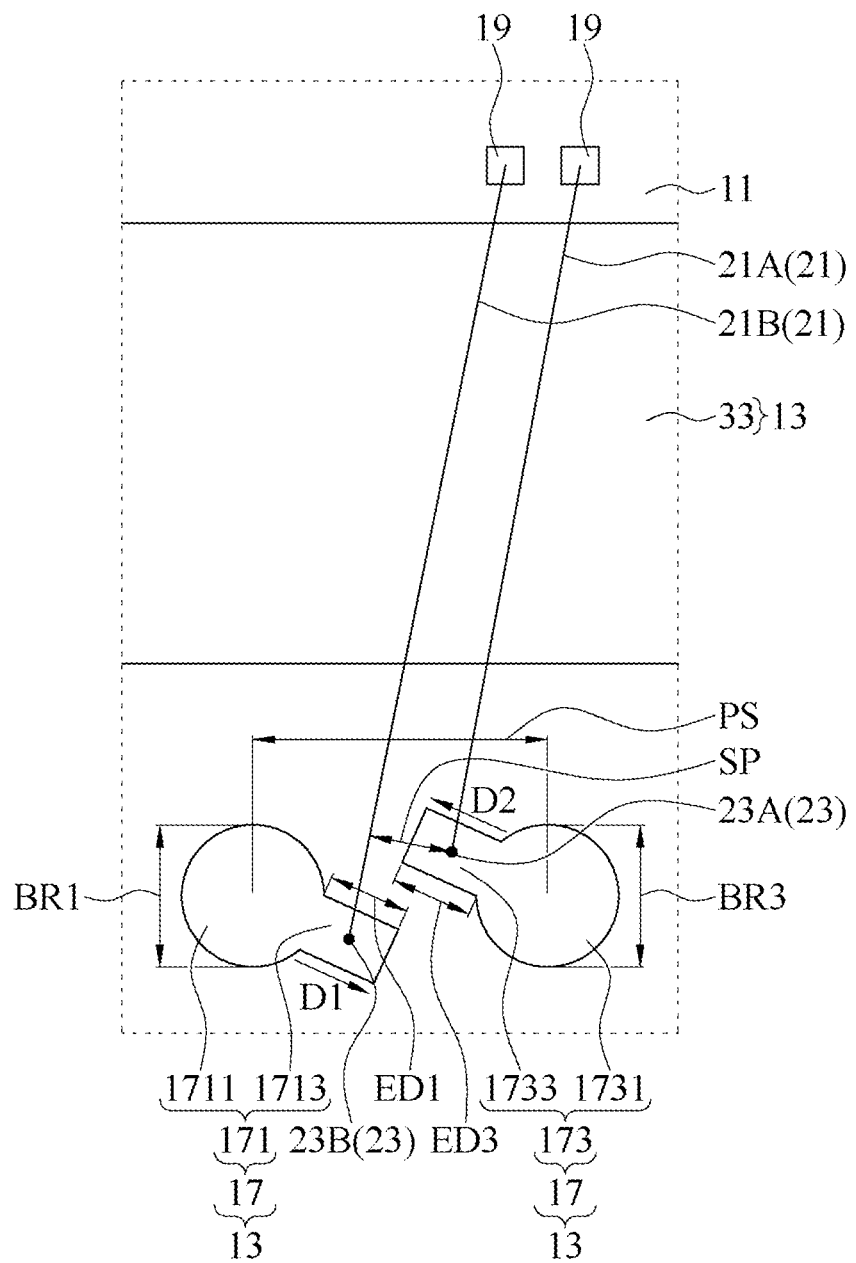
FIG. 4 is a partial schematic enlarged view of FIG. 3.

Referring to FIG. 4, FIG. 4 is a partial schematic enlarged view of FIG. 3. The leads 17 include a pair of a first lead 171 and a second lead 173. The first lead 171 includes a first body 1711 and a first extension portion 1713 connected to the first body 1711. The second lead 173 includes a second body 1731 and a second extension portion 1733 connected to the second body 1731. The first extension portion 1713 and the second extension portion 1733 extend in directions toward each other. In other words, the first extension portion 1713 and the second extension portion 1733 extend in directions facing each other.

Figure 5:
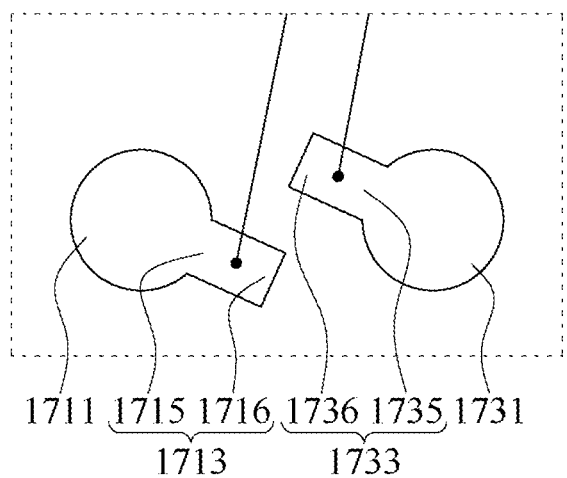
FIG. 5 is a partial schematic enlarged view of FIG. 4.

Specifically, referring to FIG. 5, FIG. 5 is a partial schematic enlarged view of FIG. 4. The first extension portion 1713 has a connection end 1715 connected to the first body 1711 and a free end 1716 opposite to the connection end 1715, and the second extension portion 1733 has a connection end 1735 connected to the second body 1731 and a free end 1736 opposite to the connection end 1735. A distance between the free ends 1716 and 1736 of the first extension portion 1713 and the second extension portion 1733 is shorter than a distance between the connection ends 1715 and 1735 of the first extension portion 1713 and the second extension portion 1733.

Since the first extension portion 1713 and the second extension portion 1733 extend toward to each other, when the first lead 171 and the second lead 173 are connected to pads 19 of the die 11 through the first extension portion 1713 and the second extension portion 1733 via the wire 21, a spacing SP between the wires 21 (for example, a short wire 21A and a long wire 21B described later) can be reduced (for example, the wires 21 are closer to each other, or the spacing SP conforms to the specification for package through wire bonding). Thus, optimizing or deploying impedance matching between the wires 21 to improve quality of signals transmitted by the wires 21, so that high-speed signals can be transmitted. For example, the spacing SP is adjusted to adjust an equivalent inductance and capacitance of the wires 21, and an impedance value is calculated according to Equation 1 to perform impedance matching on the wires 21, thus improving performance of an insertion loss and a reflection loss. In Equation 1, Z is an impedance value of the wire 21, L is a unit inductance value of the wire 21, and C is a unit capacitance value of the wire 21. In some embodiments, the high-speed signal is a pair of differential signals. The high-speed signal is, for example, but not limited to, a signal with a Nyquist frequency of 10 GHz to implement an application circuit of USB4.0 or PCIE4.0.

$$Z = \sqrt{\frac{L}{C}} \qquad \text{(Equation 1)}$$

The spacing SP is a distance between a contact 23 connected to the shorter one of the two wires 21 (herein referred to as the short wire 21A) at the lead 17 and the longer one of and the two wires 21 (herein referred to as a long wire 21B). For example, as shown in FIG. 4, the wire 21 connected to the second lead 173 is shorter than that the wire 21 connected to the first lead 171, and therefore the second lead 173 is connected to the short wire 21A. Conversely, the first lead 171 is connected to the long wire 21B, and the spacing SP between the short wire 21A and the long wire 21B is the shortest distance from the contact 23A of the short wire 21A connected to the second lead 173 to the long wire 21B.

Figure 6:
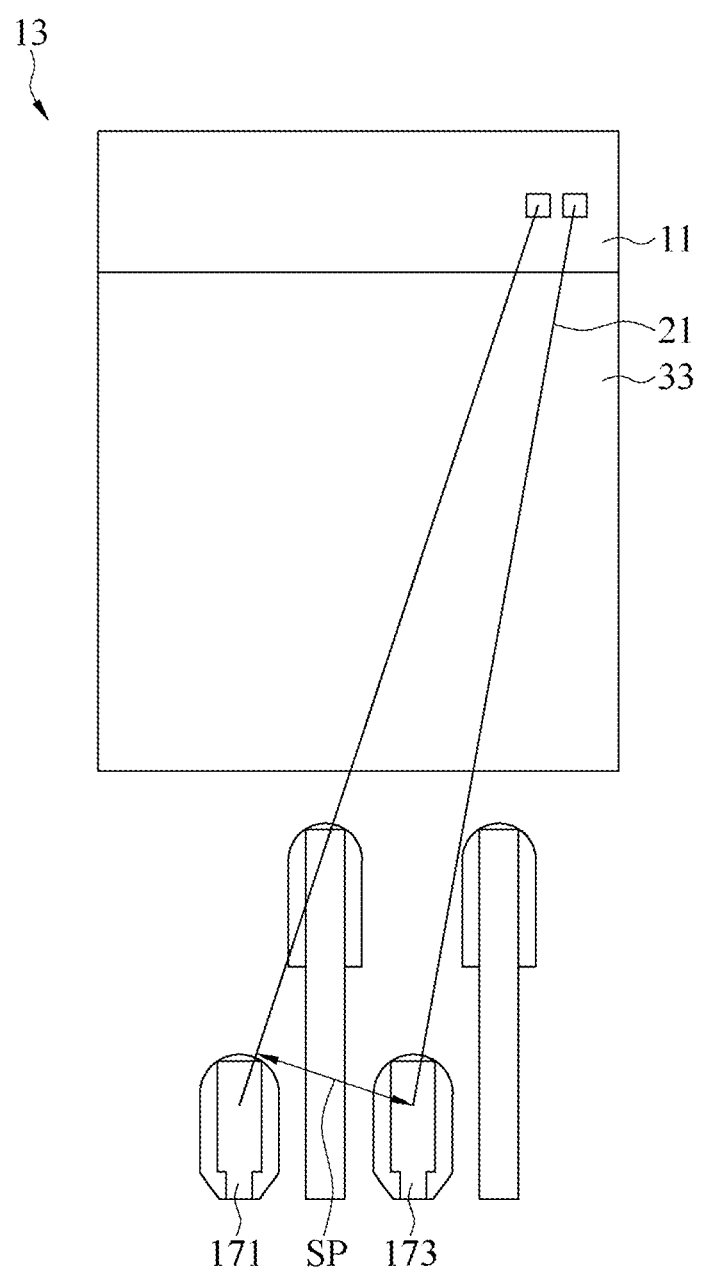
FIG. 6 is a schematic diagram of a first comparative example.

Referring to FIG. 6, FIG. 6 is a schematic diagram of a first comparative example. In the first comparative example, the first lead 171 and the second lead 173 do not have extension portions toward each other. Referring to FIG. 4 and FIG. 6 together, it can be seen that the spacing SP shown in FIG. 4 of the embodiment of the present invention is much less than the spacing SP shown in FIG. 6 of the first comparative example, so that the wires 21 can be closer to each other.

Figure 7:
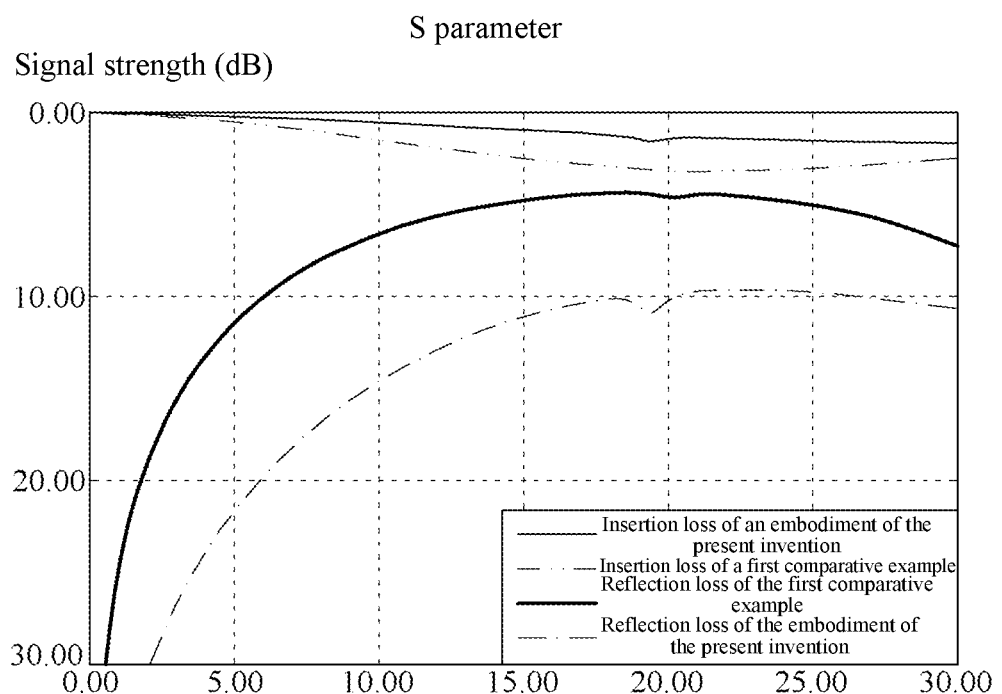
FIG. 7 is a schematic diagram of an insertion loss and a reflection loss carried by signals of an integrated circuit lead frame according to some embodiments of the present invention and the first comparative example.

Referring to FIG. 7, FIG. 7 is a schematic diagram of an insertion loss and a reflection loss carried by signals of an integrated circuit lead frame 13 according to some embodiments of the present invention and the first comparative example. It can be seen that the performance of the insertion loss and the reflection loss shown in the embodiment of the present invention is better than that of the first comparative example, resulting in a significant increase in bandwidth performance.

Figure 8:
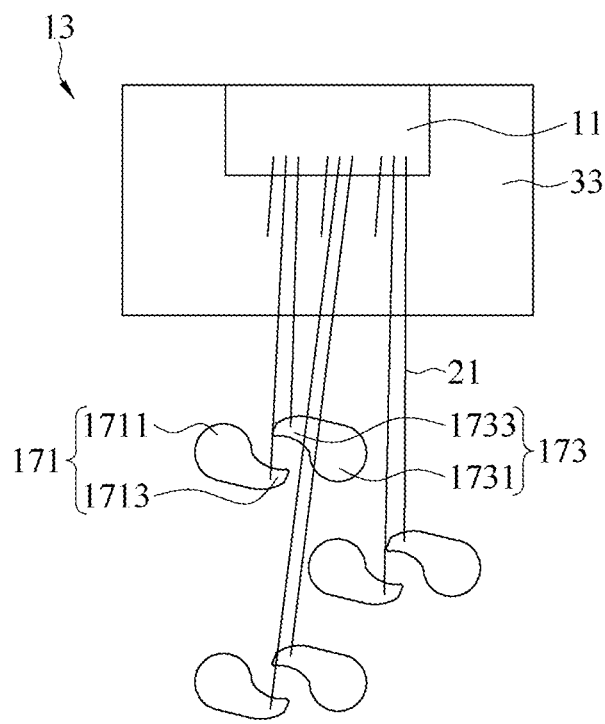
FIG. 8 is a partial schematic enlarged top view of the integrated circuit lead frame according to some embodiments of the present invention.
Figure 9:
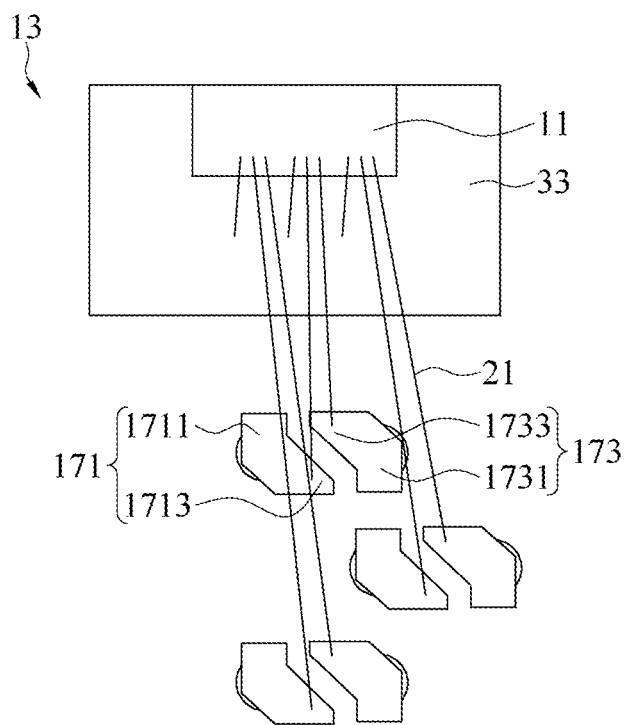
FIG. 9 is a partial schematic enlarged top view of the integrated circuit lead frame according to some embodiments of the present invention.

In some embodiments, as shown in FIG. 4 and FIG. 5, the first body 1711 and the second body 1731 are circular, and the first extension portion 1713 and the second extension portion 1733 are rectangular, which may also be of other shapes, for example, shapes shown in FIG. 8 and FIG. 9. The present invention is not limited thereto. FIG. 8 and FIG. 9 are each a partial schematic enlarged top view of the integrated circuit lead frame 13 according to some embodiments of the present invention. Different shapes cause capacitive loads generated by the leads 17 to be different. For example, if areas of the first lead 171 and the second lead 173 are relatively large due to the shape, the capacitive loads generated (provided) by the first lead 171 and the second lead 173 are greater.

In some embodiments, as shown in FIG. 4, an extension direction (herein referred to as a first direction D1) of the first extension portion 1713 and an extension direction (herein referred to as a second direction D2) of the second extension portion 1733 are parallel to each other. In this way, the wires 21 (the short wire 21A, the long wire 21B) may be made in no contact with each other to avoid occurrence of a short circuit (a signal), and corresponding configurations of the two wires 21 can be controlled, for example, a mutual positional relationship between the contacts 23 (contacts 23A, 23B) connected to the two wires 21 (the short wire 21A, the long wire 21B) on the leads (the first lead 171 and the second lead 173), an amount of reduction in the spacing SP between the wires 21, and the like.

In some embodiments, a distance between the first extension portion 1713 and the second extension portion 1733 may be configured to be not less than the minimum setting value of the manufacturing process. For example, a distance between the first extension portion 1713 and the second extension portion 1733 is not less than 0.1 mm.

In some embodiments, as shown in FIG. 4, an extension length ED1, ED3 of the first extension portion 1713 and the second extension portion 1733, a lead spacing PS between the first lead 171 and the second lead 173, and a body diameter BR1, BR3 of the first body 1711 and the second body 1731 are related to each other. Specifically, the extension length ED1, ED3, the lead spacing PS, and the body diameter BR1, BR3 are positively correlated with each other. For example, when the lead spacing PS is relatively large, the body diameter BR1, BR3 and the extension length ED1, ED3 are relatively large. When the lead spacing PS is relatively small, the body diameter BR1, BR3 and the extension length ED1, ED3 are relatively small. The lead spacing PS is a distance from a center point of the first body 1711 to a center point of the second body 1731. High-density packaging (for example, packaging of the multi-column leads 17 of the semiconductor device 10) can be achieved through different proportions of the lead spacing PS, the extension length ED1, ED3, and the body diameter BR1, BR3.

Figure 10:
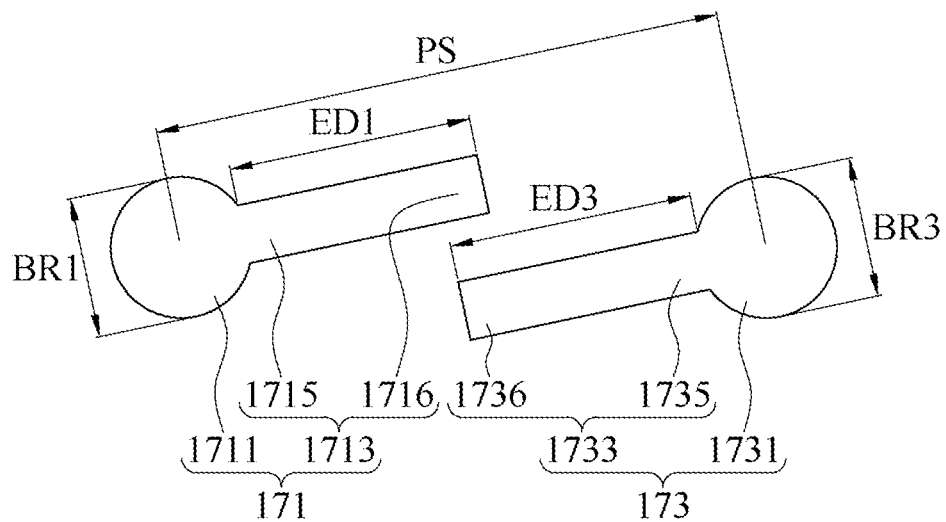
FIG. 10 is a schematic diagram of a same pair of a first lead and a second lead according to some embodiments of the present invention.
Figure 11:
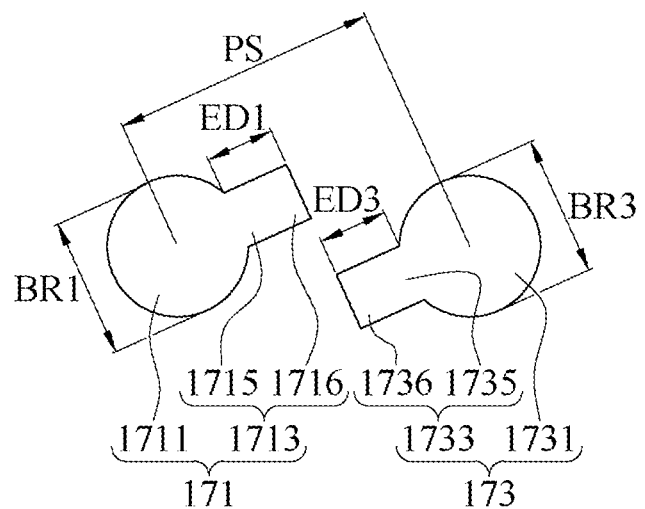
FIG. 11 is a schematic diagram of a same pair of a first lead and a second lead according to some embodiments of the present invention.

Referring to FIG. 10 and FIG. 11, FIG. 10 is a schematic diagram of a same pair of a first lead 171 and a second lead 173 according to some embodiments of the present invention. FIG. 11 is a schematic diagram of a same pair of a first lead 171 and a second lead 173 according to some embodiments of the present invention. In some embodiments, body diameters BR1, BR3 of a first body 1711 and a second body 1731 are respectively 0.4 to 2 times the extension length ED1 and ED3 of the first extension portion 1713 and the second extension portion 1733. For example, as shown in FIG. 10, when the lead spacing PS is 1 mm, the body diameter BR1, BR3 is 0.225 mm, and the extension length ED1, ED3 is approximately twice times the body diameter BR1, BR3. For another example, as shown in FIG. 11, when the lead spacing PS is 0.8 mm, the body diameter BR1, BR3 is 0.425 mm, and the extension length ED1, ED3 is 0.46 times the body diameter BR1, BR3. In this way, high-density packaging of the chip leads 17 is implemented.

In some embodiments, the extension length ED1, ED3 may be set according to a spacing SP between wires 21 respectively connected to the first extension portion 1713 and the second extension portion 1733. For example, the extension length ED1, ED3 is configured in such a way that the spacing SP is not greater than five times a wire diameter of each of the wires 21. Therefore, the extension lengths ED1 and ED3 of the first extension portion 1713 and the second extension portion 1733 are set in such a way that the spacing SP can meet the specification of packaging through wire bonding.

In some embodiments, as shown in FIG. 10, when the lead spacing PS between the first lead 171 and the second lead 173 is relatively large, the extension length ED1, ED3 (that is, a distance between a connection end 1715, 1735 and a free end 1716, 1736) of the first lead 171 and the second lead 173 can be relatively large. Therefore, the first extension portion 1713 and the second extension portion 1733 are partially staggered, that is, the free end 1716 of the first extension portion 1713 and the free end 1736 of the second extension portion 1733 is in a staggered arrangement. However, the present invention is not limited thereto. As shown in FIG. 11, when the lead spacing PS between the first lead 171 and the second lead 173 is relatively small, the extension length ED1, ED3 (that is, a distance between a connection end 1715, 1735 and a free end 1716, 1736) of the first lead 171 and the second lead 173 can be relatively small. Therefore, the first extension portion 1713 and the second extension portion 1733 may not be in the staggered arrangement, that is, the free end 1716 of the first extension portion 1713 and the free end 1736 of the second extension portion 1733 may not be in the staggered arrangement.

Figure 12:
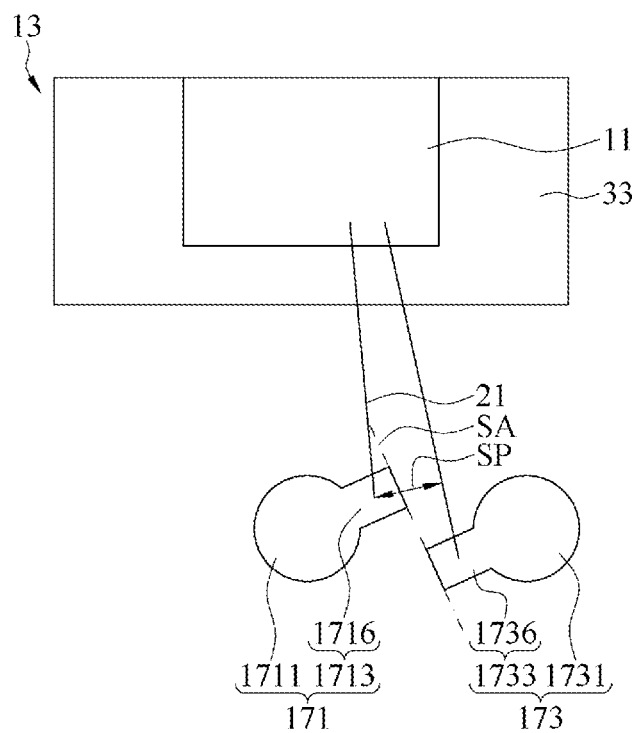
FIG. 12 is a partial schematic enlarged top view of the integrated circuit lead frame according to some embodiments of the present invention.
Figure 13:
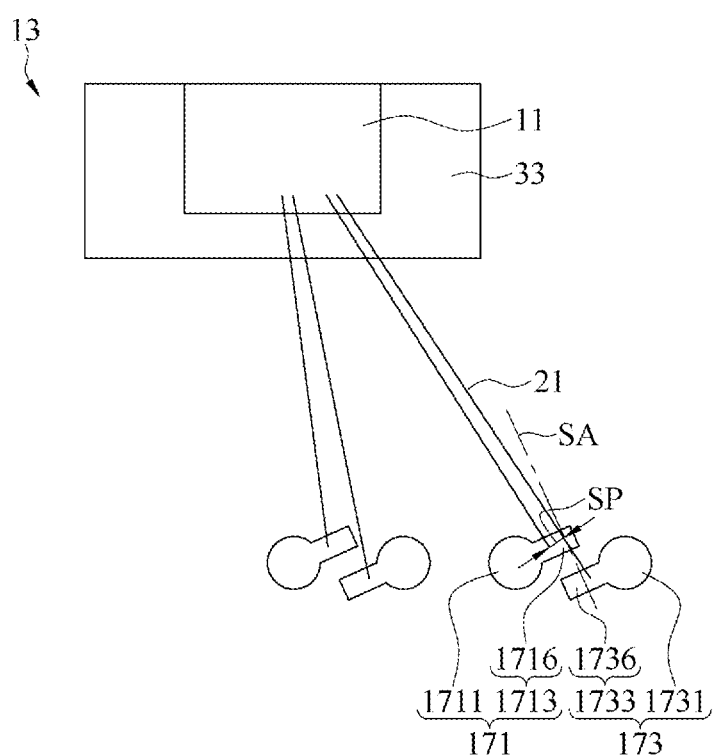
FIG. 13 is a partial schematic enlarged top view of the integrated circuit lead frame according to some embodiments of the present invention.
Figure 14:
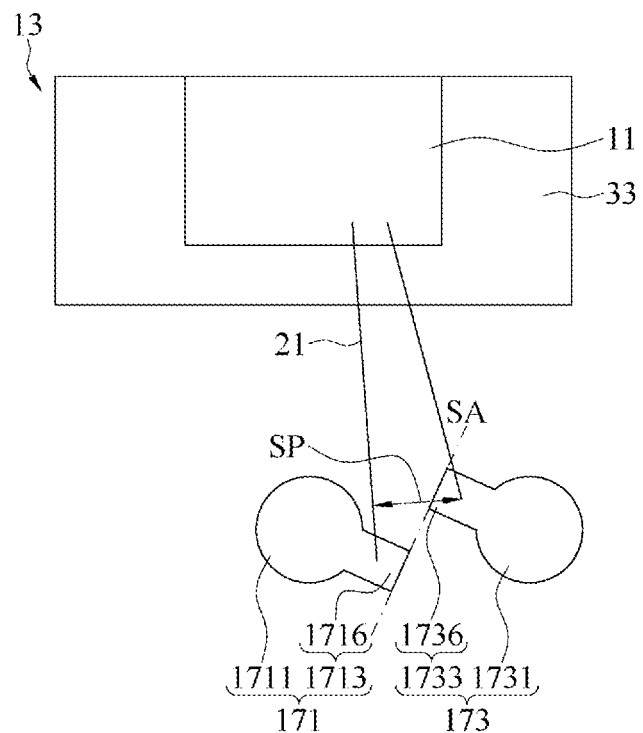
FIG. 14 is a schematic diagram of a second comparative example.
Figure 15:
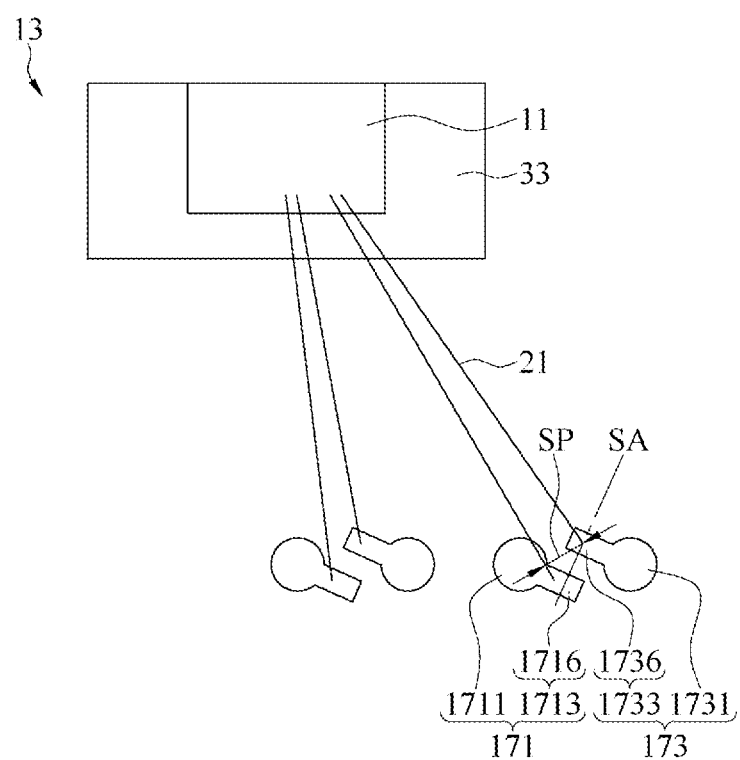
FIG. 15 is a schematic diagram of a third comparative example.

Referring to FIG. 12 and FIG. 13, FIG. 12 is a partial schematic enlarged top view of the integrated circuit lead frame 13 according to some embodiments of the present invention. FIG. 13 is a partial schematic enlarged top view of the integrated circuit lead frame 13 according to some embodiments of the present invention. Free ends 1716, 1736 of the first extension portion 1713 and the second extension portion 1733 (or a part at which the free ends 1716, 1736 of the first extension portion 1713 and the second extension portion 1733 staggered) are located on a staggered axis SA, and the staggered axis SA is directed to the die 11 on the die pad 33. It can be seen that the wires 21 are relatively close to each other, that is, the spacing SP between the two wires 21 is reduced, and the two wires 21 may be caused to have a consistent spacing SP from the die 11 to the first lead 171 and the second lead 173. Referring to FIG. 14 and FIG. 15, FIG. 14 is a schematic diagram of a second comparative example. FIG. 15 is a schematic diagram of a third comparative example. In the second comparative example and the third comparative example, a staggered axis SA on which free ends 1716, 1736 of the first extension portion 1713 and the second extension portion 1733 (or a part at which the free ends 1716, 1736 of the first extension portion 1713 and the second extension portion 1733 staggered) are located is not directed to the die 11 on the die pad 33. Referring to FIG. 12 to FIG. 15 together, it can be seen that the spacing SP shown in FIG. 12 and FIG. 13 of the embodiments of the present invention is much less than the spacing SP shown in FIG. 14 of the second comparative example and FIG. 15 of the third comparative example. The wires 21 for transmitting differential signals shown in FIG. 12 and FIG. 13 from the die 11 to the first lead 171 and the second lead 173 have a consistent spacing SP compared with the second comparative example and the third comparative example of FIG. 14 and FIG. 15. Thus, the wires 21 in FIG. 12 and FIG. 13 may maintain the quality of the differential signals.

Figure 16:
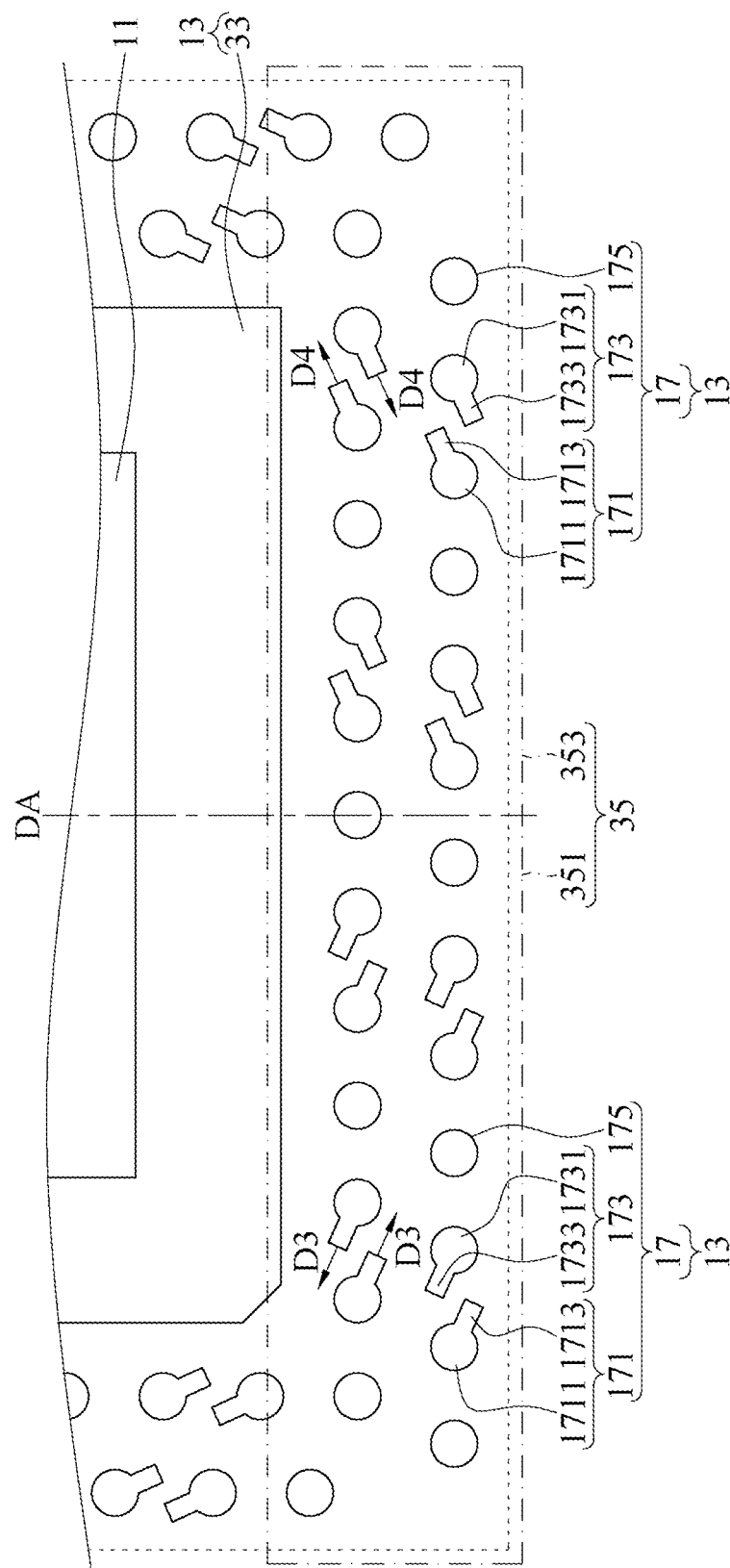
FIG. 16 is a partial schematic enlarged top view of the integrated circuit lead frame according to some embodiments of the present invention.

Referring to FIG. 16, FIG. 16 is a partial schematic enlarged top view of the integrated circuit lead frame 13 according to some embodiments of the present invention. The leads 17 are around the die pad 33. A side area 35 is on a side of the die pad 33. The side area 35 is divided into a first area 351 and a second area 353 by an axis DA passing through the die pad 33. The first extension portion 1713 and the second extension portion 1733 in the first area 351 have first extension directions D3, and the first extension portion 1713 and the second extension portion 1733 in the second area 353 have second extension directions D4. The first extension directions D3 are different from the second extension directions D4.

In some embodiments, a position of the axis DA may be configured according to a position of the die 11 on the die pad 33 and the wire bonding direction to optimize the spacing SP between the two wires 21. For example, if a die 11 is disposed in the center of the die pad 33, the axis DA may be a central axis passing through the die pad 33. If a die 11 is disposed on a left side (or a right side) of the die pad 33, the axis DA may be the central axis of the die 11. If a plurality of dies 11 are disposed on the die pad 33, the axis DA may be a middle axis between the dies 11.

In some embodiments, the first extension directions D3 and the second extension directions D4 are axially symmetrical with respect to the axis DA. For example, as shown in FIG. 16, the first extension directions D3 of the first extension portion 1713 and the second extension portion 1733 in the first area 351 are respectively extending to the upper left and lower right, and the second extension directions D4 of the first extension portion 1713 and the second extension portion 1733 in the second area 353 are respectively extending to the upper right and lower left.

In some embodiments, the first lead 171 and the second lead 173 are configured to transmit a pair of differential signals. Since the differential signals generally need to be transmitted by two wires 21 of an equal length and an equal width and that are close to each other, and lengths of the different wires 21 (the short wire 21A and the long wire 21B shown in FIG. 4) and the spacing SP between the wires 21 have significant impacts on quality of the differential signals. Therefore, the lengths of the wires 21 configured to transmit differential signals and the spacing SP between the wires 21 need to be strictly regulated. By transmitting a pair of differential signals with the first lead 171 and the second lead 173 extending in the directions toward each other, a size of the spacing SP can be controlled (for example, the size of the spacing SP can be reduced) to meet the specification of packaging through wire bonding. In addition, by controlling the characteristic impedance of the wires 21, the quality of the differential signal can be maintained, so that the high-speed differential signal can be transmitted. The pair of differential signals may be two high-speed or low-speed signals with the same amplitude and opposite phases.

In some embodiments, the first lead 171 and the second lead 173 have the same shape, but the present invention is not limited thereto. The first lead 171 and the second lead 173 may have different shapes. When the first lead 171 and the second lead 173 have the same shape, attenuation of the signals transmitted by the wires 21 connected to the first lead 171 and the second lead 173 may be made consistent (for example, the attenuation of a pair of high-speed differential signals at high frequencies is the same), so that the quality or amplitude of the signals (such as a pair of high-speed differential signals) between the wires 21 of the first lead 171 and the second lead 173 is the same or uniform.

In some embodiments, the first lead 171 or the second lead 173 is configured to transmit a power signal. In some embodiments, the first lead 171 and the second lead 173 are configured to transmit power through the power signal. The pair of leads (the first lead 171 and the second lead 173) may be respectively connected to a positive terminal and a negative terminal to receive power signal. In some embodiments, the first lead 171 or the second lead 173 in one pair of the pairs of the leads 17 (that is, a pair of the first lead 171 and the second lead 173) and the first lead 171 or the second lead 173 in another pair of the pairs of the leads 17 (that is, another pair of the first lead 171 and the second lead 173) may transmit a pair of differential signals. For example, the first lead 171 in the first pair and the first lead 171 in the second pair transmit a pair of differential signal together. In some embodiments, the first lead 171 and the second lead 173 in the same pair (or in the different pair) may transmit signals (such as single-ended signals) that not paired with each other. For example, the first lead 171 and the second lead 173 may transmit non-differential clock signals, and the like.

In some embodiments, as shown in FIG. 2, FIG. 3, and FIG. 16, the leads 17 further includes a third lead 175. The third lead 175 has the same shape as the first body 1711 or the second body 1731 to have the same signal attenuation caused by the first lead 171 and the second lead 173, but the present invention is not limited thereto. The third lead 175 may have a different shape from the first body 1711 or the second body 1731. In some embodiments, the third lead 175 may transmit signals (such as single-ended signals) that not paired with each other. For example, the third lead 175 may transmit non-differential clock signals, and the like. In some embodiments, the first lead 171 or the second lead 173 may transmit a pair of differential signals with the third lead 175.

In some embodiments, the pair of the first lead 171 and the second lead 173 may be configured adjacent to each other. In some embodiments, as shown in FIG. 2, FIG. 3, and FIG. 16, at least one third lead 175 may be configured between adjacent two pair of leads 17 (that is, two pair of the first lead 171 and the second lead 173 that are adjacent to each other), to enhance isolation between the differential signals of different pairs of the leads (that is, the first leads 171 and the second leads 173 in different pairs), thus avoiding mutual interference between the signals. Here, only one third lead 175 is configured between adjacent two pair of leads 17, but the present invention is not limited thereto, a plurality of third leads 175 may alternatively be configured between adjacent two pair of leads 17.

Figure 17:
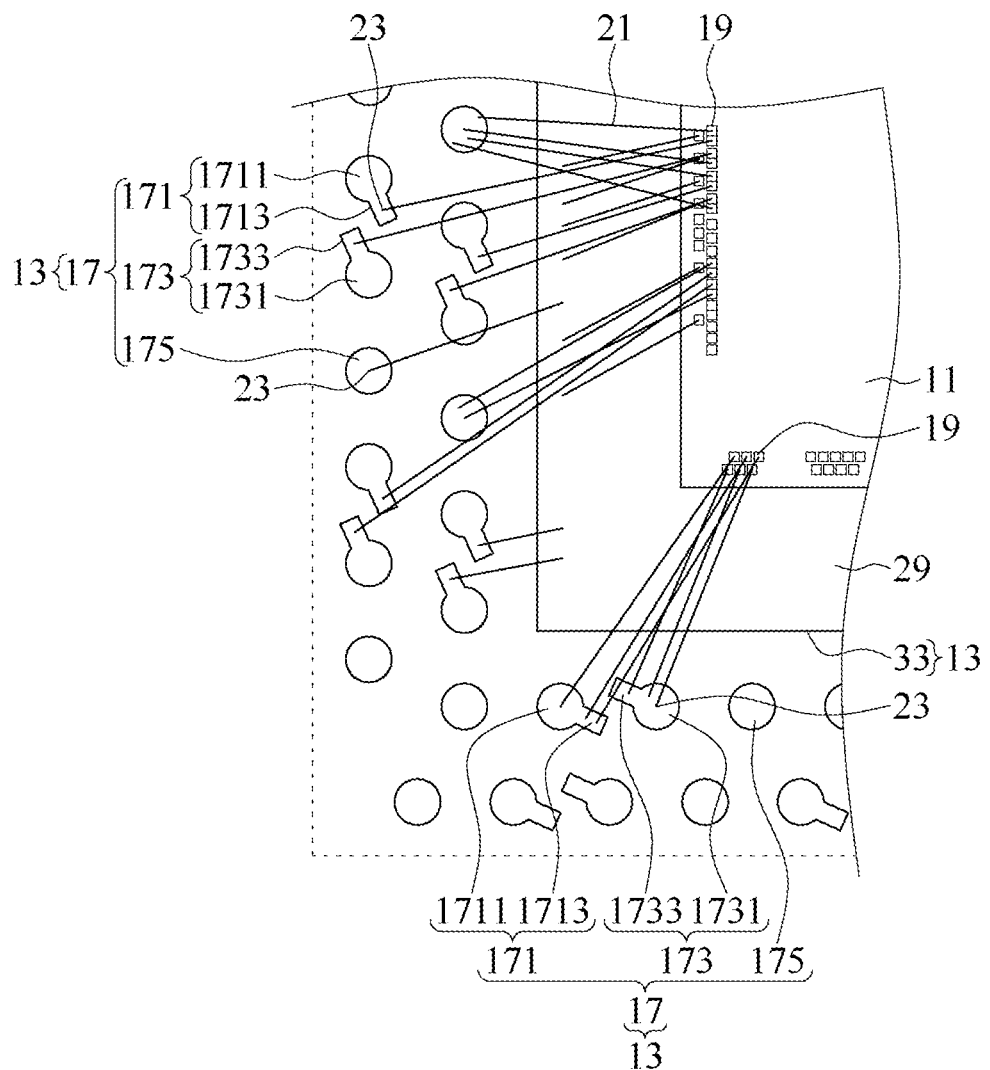
FIG. 17 is a partial schematic enlarged top view of the integrated circuit lead frame according to some embodiments of the present invention.

Referring to FIG. 17, FIG. 17 is a partial schematic enlarged top view of the integrated circuit lead frame 13 according to some embodiments of the present invention. In some embodiments, the leads 17 may be respectively connected to the pad 19 of the die 11 or a solder pad 29 of the die pad 33 via at least one wire 21 through wire bonding. That is, the contacts 23 of the leads 17 may be bonded to one end of at least one wire 21, and the other end of the wire 21 is bonded to the pad 19 of the die 11 or the solder pad 29 of the die pad 33. Specifically, one lead 17 (such as the first lead 171, the second lead 173, or the third lead 175) may be connected to the pad 19 of the die 11 or the solder pad 29 of the die pad 33 via more than one wire 21, so that the lead 17 can transmit one or more same signals to the outside of the above semiconductor device 10 at a time. Therefore, one lead 17 may have one or more contacts 23.

In some embodiments, the pad 19 of the die 11 may be connected to the solder pad 29 of the die pad 33 through wire bonding to transmit a ground signal. Specifically, the solder pad 29 is bonded to one end of at least one wire 21, the other end of the at least one wire 21 is bonded to the pad 19 of the die 11, and the solder pad 29 receives the ground signal from the die 11 via the wire 21 and transmits the ground signal to the outside of the above semiconductor device 10. In some embodiments, when the lead 17 is connected to the solder pad 29 of the die pad 33 through wire bonding, the lead 17 transmits the ground signal to the outside of the above semiconductor device 10.

Referring to FIG. 4 and FIG. 17, in some embodiments, the first lead 171 is connected to the pad 19 of the die 11 through wire bonding from the first extension portion 1713. The second lead 173 is connected to the pad 19 of the die 11 through wire bonding from the second extension portion 1733. In other words, the contact 23 of the first lead 171 may be at the first extension portion 1713, and the contact 23 of the second lead 173 may be at the second extension portion 1733, so as to control the spacing SP and the impedance matching of the wires 21, so that the first lead 171 and the second lead 173 can transmit high-speed signals.

In some embodiments, the first extension portion 1713 and the second extension portion 1733 may be connected by at least one wire 21 through wire bonding (that is, the first extension portion 1713 and the second extension portion 1733 may have at least one contact 23). If the first lead 171 and the second lead 173 are connected to the wires 21 only through the first extension portion 1713 and the second extension portion 1733, then the wires 21 connected to the first lead 171 and the second lead 173 may transmit high-speed signals (such as high-speed differential signals), and may also transmit low-speed signals (such as low-speed differential signals), power signals, or single-ended signals. The present invention is not limited thereto.

In some embodiments, the first lead 171 is connected to the pad 19 of the die 11 through wire bonding from the first body 1711. The second lead 173 is connected to the pad 19 of the die 11 through wire bonding from the second body 1731. In other words, the contact 23 of the first lead 171 may be in the first body 1711, and the contact 23 of the second lead 173 may be in the second body 1731.

In some embodiments, the first body 1711 and the second body 1731 may be connected by at least one wire 21 through wire bonding (that is, the first body 1711 and the second body 1731 may have at least one contact 23). If the first lead 171 and the second lead 173 are connected to the wires 21 only through the first body 1711 and the second body 1731, then the wires 21 connected to the first lead 171 and the second lead 173 may transmit low-speed signals (such as low-speed differential signals), power signals, or single-ended signals. In some embodiments, the first lead 171 may be simultaneously connected to a plurality of wires 21 through the first extension portion 1713 and the first body 1711, and the second lead 173 may be simultaneously connected to a plurality of wires 21 through the second extension portion 1733 and the second body 1731, and then the wires 21 connected to the first lead 171 and the second lead 173 may transmit low-speed signals, power signals, or single-ended signals.

In some embodiments, the spacing SP between each of the wires 21 connecting the same pair of the first lead 171 and the second lead 173 is not greater than five times a wire diameter of each of the wires 21, so that the wires 21 of the first lead 171 and the second lead 173 have a similar length, and the spacing SP meets the requirements to optimize the impedance matching of the wires 21, thus transmitting high-speed signals. In this embodiment, the same pair of the first lead 171 and the second lead 173 with the spacing SP between the wires 21 not greater than five times the wire diameter may transmit high-speed signals (for example, a pair of high-speed differential signals), and may also transmit low-speed signals (such as a pair of low-speed differential signals), power signals, single-ended signals, or the like. The present invention is not limited thereto.

In some embodiments, as shown in FIG. 1, the first lead 171 and the second lead 173 are respectively connected to the die 11 through wire bonding via at least one wire 21, and each of the wires 21 connecting the same pair of the first lead 171 and the second lead 173 has the same loop height LH. Here, for convenience of description in FIG. 1, only the first lead 171 and the second lead 173 are respectively connected to the die 11 through wire bonding via one wire 21, but the present invention is not limited thereto. The first lead 171 and the second lead 173 may be respectively connected to the die 11 through wire bonding via a plurality of wires 21. The wires 21 of the first lead 171 and the second lead 173 have the same loop height LH, so that the lengths of the wires 21 of the first lead 171 and the second lead 173 can be more similar to control the size of the spacing SP of the wires 21 and impedance matching of the wires 21, thus transmitting high-speed signals. In this embodiment, the same pair of the first lead 171 and the second lead 173 with the same loop height LH may transmit high-speed signals (for example, a pair of high-speed differential signals), and may also transmit low-speed signals (such as a pair of low-speed differential signals), power signals, single-ended signals, or the like. The present invention is not limited thereto.

Figure 18:
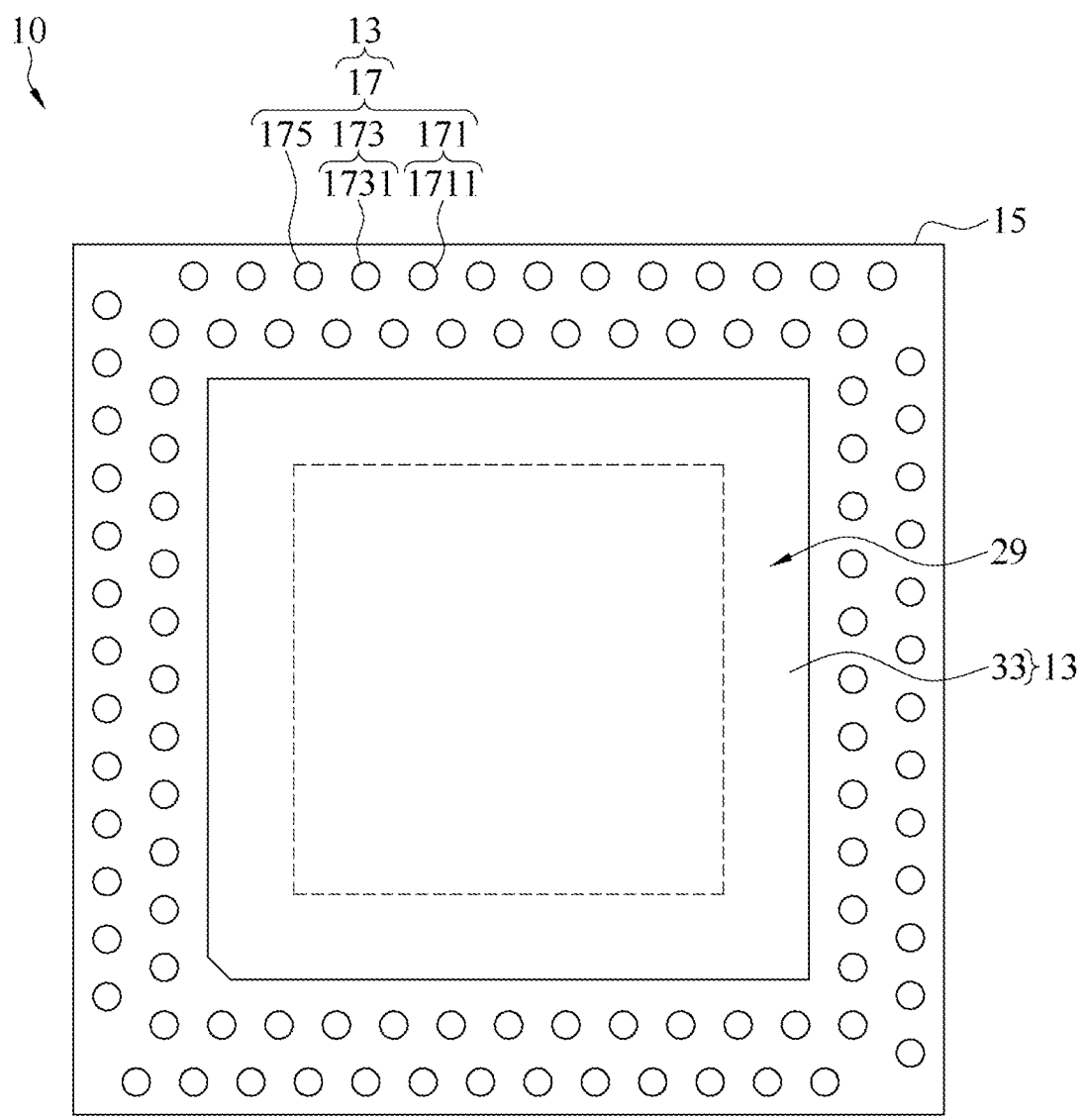
FIG. 18 is a schematic bottom view of the semiconductor device according to some embodiments of the present invention.
Figure 19:
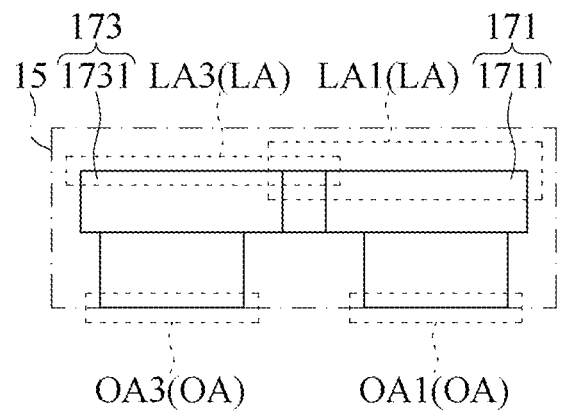
FIG. 19 is a schematic cross-sectional side view of the same pair of a first lead and a second lead according to some embodiments of the present invention.

Referring to FIG. 18, FIG. 18 is a schematic bottom view of the semiconductor device 10 according to some embodiments of the present invention. In some embodiments, FIG. 18 may also be a schematic bottom view of an integrated circuit lead frame 13. In some embodiments, the first body 1711 and the second body 1731 are exposed from the package 15, and the first extension portion 1713 and the second extension portion 1733 (not shown in FIG. 18) are in the package 15. Specifically, bottoms of the first body 1711 and the second body 1731 are exposed from the package 15 for connection to circuits outside the semiconductor device 10 (such as a circuit board outside the semiconductor device 10), so that the bottom can obtain signals from the die 11 (such as high-speed/low-speed differential signals, power signals, single-ended signals, or the like) or can transmit signals to the die 11. When the first extension portion 1713 and the second extension portion 1733 are encapsulated in the package 15, interference caused by the external circuit during connection can be reduced, for example, short-circuit with other circuits. In some embodiments, a bottom of the solder pad 29 of the die pad 33 may be exposed from the package 15 for connection to circuits outside the semiconductor device 10 to transmit signals (such as ground signals, or the like). In some embodiments, a bottom of the third lead 175 may be exposed from the package 15 for connection to circuits outside the semiconductor device 10 to transmit signals (such as single-ended signals, or the like). In some embodiments, an area of the lead 17 for connection to the wires 21 through wire bonding (or an area in which the contact 23 may be disposed) (hereinafter referred to as a wire bonding area LA) may be slightly larger or the same as an area of the bottom of the lead 17 exposed from the package 15 (hereinafter referred to as an exposed area OA). For example, referring to FIG. 19, FIG. 19 is a schematic cross-sectional side view of the same pair of the first lead 171 and the second lead 173 according to some embodiments of the present invention. A wire bonding area LA1 of the first body 1711 of the first lead 171 and a wire bonding area LA3 of the second body 1731 of the second lead 173 may be slightly larger than or the same as an exposed area OA1 of the bottom of the first body 1711 exposed from the package 15 and an exposed area OA3 of the bottom of the second body 1731 exposed from the package 15.

Figure 20:
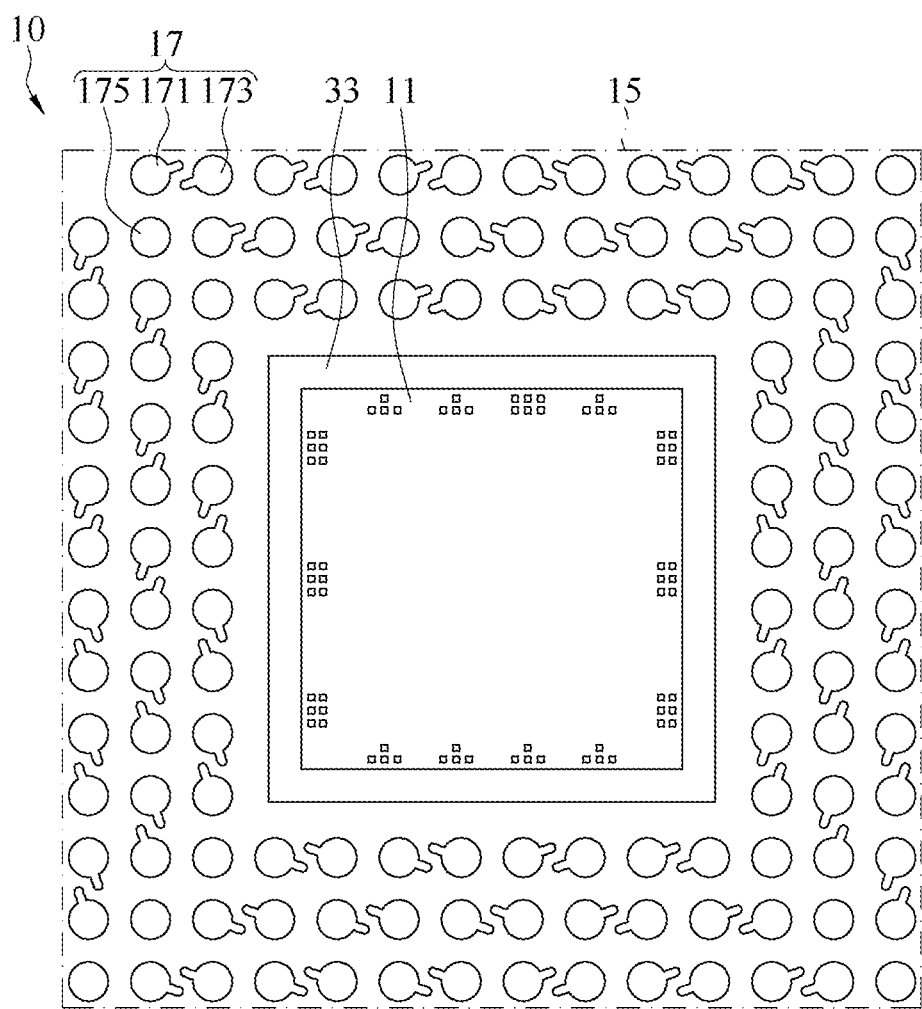
FIG. 20 is a schematic top view of the integrated circuit lead frame according to some embodiments of the present invention.

Referring to FIG. 3 and FIG. 20, FIG. 20 is a schematic top view of the integrated circuit lead frame 13 according to some embodiments of the present invention. It can be seen that the leads 17 of the present invention are designed in such a way that the leads 17 (such as the first lead 171, the second lead 173, and the third lead 175) are arranged in plurality of rows around the die pad 33. For example, as shown in FIG. 3, each side of the die pad 33 has leads 17 arranged in two rows. As shown in FIG. 20, each side of the die pad 33 has leads 17 arranged in three rows. As a result, a number of leads 17 of a single semiconductor device 10 is greatly increased.

Figure 21:
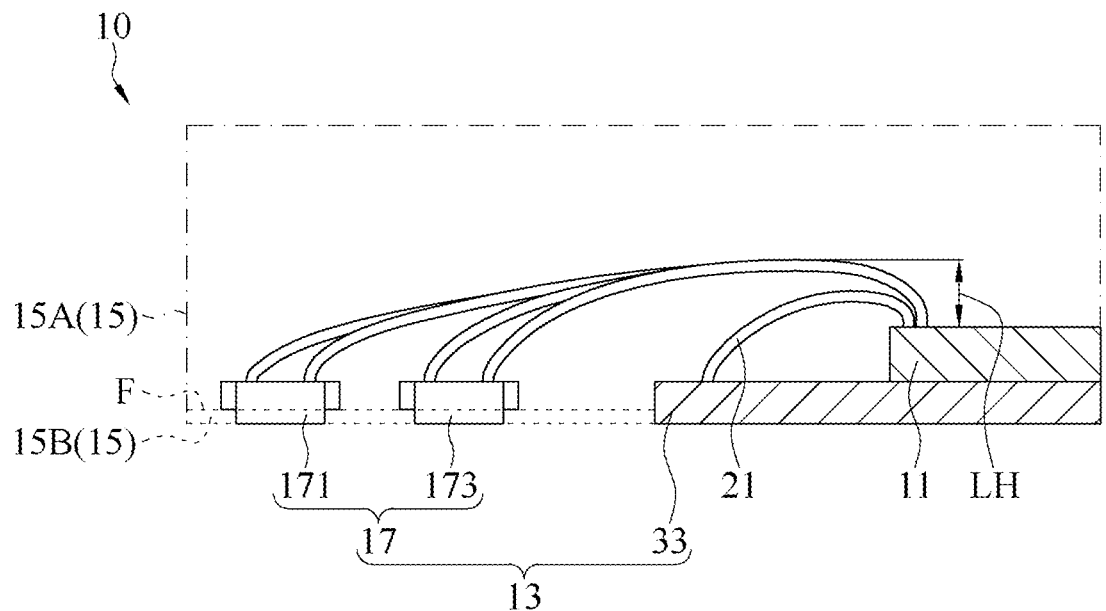
FIG. 21 is a schematic cross-sectional side view of the semiconductor device according to some embodiments of the present invention.

Referring to FIG. 21, FIG. 21 is a schematic cross-sectional side view of the semiconductor device 10 according to some embodiments of the present invention. In some embodiments, the semiconductor device 10 may be packaged by adopting the packaging technology such as the advanced quad-flat no-leads (AQFN) package. For example, after a shape of the integrated circuit lead frame 13 in the upper half of a forming line F in FIG. 21 is formed first, and elements in the upper half of the forming line F may be packaged (for example, encapsulated) via a package 15A, a metal part (such as a copper metal part of the integrated circuit lead frame 13) in the lower half of the forming line F is formed into the shape of the lower half of the forming line F through an etching process. Then, the etched part is filled through a package 15B, and finally a part of the metal is exposed from the package 15. Since the forming process of the AQFN package is more flexible than that of the traditional quad-flat no-leads (QFN), the design of the shape of the lead 17 can be more diversified and unlimited. In some embodiments, the material used for the package 15A in the upper half of the forming line F may be different from the material used for the package 15B on the lower half of the forming line F, but the present invention is not limited thereto. The material used for the package 15A in the upper half of the forming line F may be the same as the material used for the package 15B in the lower half of the forming line F.

Figure 22:
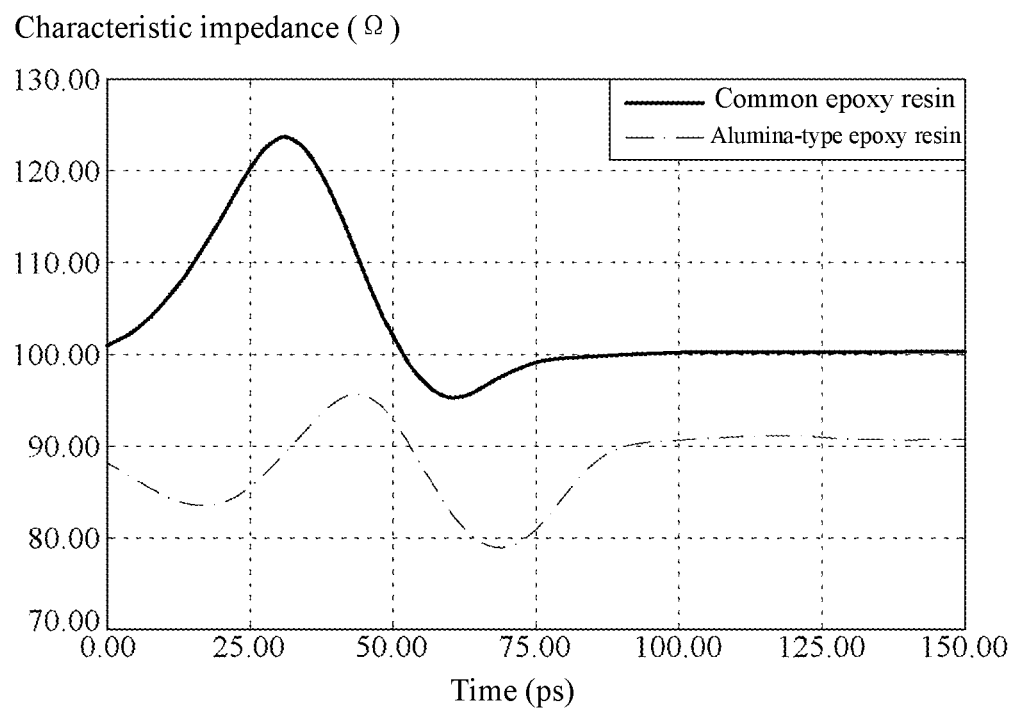
FIG. 22 is a schematic diagram of an impedance system according to some embodiments of the present invention.

Referring to FIG. 22, FIG. 22 is a schematic diagram of an impedance system according to some embodiments of the present invention. In some embodiments, a material of a package 15 may be selected according to the impedance system applied to the semiconductor device 10. For example, if the semiconductor device 10 is applied to a 100 ohm impedance system, the material of the package 15 may be an ordinary epoxy resin. If the semiconductor device 10 is applied to an 85 ohm or 90 ohm impedance system, the material of the package 15 may be an alumina-type epoxy resin, but the present invention is not limited thereto.

In some embodiments, the integrated circuit lead frame 13 may cause distribution positions or a number of the leads 17 of one of a plurality of corners to be different from distribution positions or a number of the leads 17 of the other corners (for example, as shown in FIG. 20, the number of leads 17 in one of the plurality of corners of the integrated circuit lead frame 13 may be less than the number of leads 17 in the other corners), so that the user can identify the integrated circuit lead frame 13 and a direction in which the semiconductor device 10 including the integrated circuit lead frame 13 is disposed (for example, the direction in which the integrated circuit lead frame 13 is disposed on the semiconductor device 10 or the direction in which the semiconductor device 10 is disposed on the circuit board). In some embodiments, a shape of one of the plurality of corners of the die pad 33 may be configured to be different from shapes of the other corners. For example, as shown in FIG. 2 and FIG. 3, one of the plurality of corners of the die pad 33 is an unfilled corner, and the other corners are not unfilled corners, so as to help identify the directions in which the integrated circuit lead frame 13 and the semiconductor device 10 are disposed.

Based on the above, according to the embodiments of the present invention, by virtue of the shape design of the leads (for example, contacts of the pair of the two leads for connection through wire bonding extend in directions toward each other) and the packaging technology of wire bonding, the spacing between wires of the pair of the leads connected through wire bonding can be shortened to obtain good impedance matching, thereby providing high-speed signal transmission and reducing process costs.

What is claimed is:

1. An integrated circuit lead frame, comprising:
   a die pad provided to attach a die; and
   a plurality of leads provided for connection to the die through wire bonding, wherein the leads comprise a pair of a first lead and a second lead, the first lead comprises a first body and a first extension portion connected to the first body, and the second lead comprises a second body and a second extension portion connected to the second body, wherein the first extension portion and the second extension portion extend in directions toward each other, the first extension portion and the second extension portion are configured to provide contact with a bonding wire.

2. The integrated circuit lead frame according to claim 1, wherein the first extension portion extends in a first direction, the second extension portion extends in a second direction, and the first direction and the second direction are parallel to each other.

3. The integrated circuit lead frame according to claim 1, wherein the first lead and the second lead have the same shape.

4. The integrated circuit lead frame according to claim 1, wherein the first extension portion and the second extension portion are partially staggered.

5. The integrated circuit lead frame according to claim 1, wherein the first lead and the second lead transmit a pair of differential signals.

6. The integrated circuit lead frame according to claim 1, wherein the first lead transmits a power signal.

7. The integrated circuit lead frame according to claim 1, wherein the first lead is connected to the die through wire bonding from the first extension portion.

8. The integrated circuit lead frame according to claim 7, wherein the first lead is connected to the die through wire bonding from the first body.

9. The integrated circuit lead frame according to claim 1, wherein the leads further comprise a third lead, and the third lead has the same shape as the first body or the second body.

10. A semiconductor device, comprising:
    a die;

an integrated circuit lead frame comprising:
  a die pad provided for disposing the die; and
  a plurality of leads provided for connection to the die through wire bonding, wherein the leads comprise a pair of a first lead and a second lead, the first lead comprises a first body and a first extension portion connected to the first body, and the second lead comprises a second body and a second extension portion connected to the second body, wherein the first extension portion and the second extension portion extend in directions toward each other, the first extension portion and the second extension portion are configured to provide contact with a bonding wire; and
  a package encapsulating the die and a part of the integrated circuit lead frame.

11. The semiconductor device according to claim 10, wherein the first body and the second body are exposed from the package, and the first extension portion and the second extension portion are in the package.

12. The semiconductor device according to claim 10, wherein the leads are around the die pad, an area on a side of the die pad is divided into a first area and a second area by an axis passing through the die pad, and a first extension direction of the first extension portion and the second extension portion in the first area is different from a second extension direction of the first extension portion and the second extension portion in the second area.

13. The semiconductor device according to claim 12, wherein the first extension direction and the second extension direction are axially symmetrical with respect to the axis.

14. The semiconductor device according to claim 12, wherein the first extension portion and the second extension portion are partially staggered.

15. The semiconductor device according to claim 12, wherein free ends of the first extension portion and the second extension portion are on a staggered axis, and the staggered axis is directed to the die.

16. The semiconductor device according to claim 10, wherein the first extension portion extends in a first direction, the second extension portion extends in a second direction, and the first direction and the second direction are parallel to each other.

17. The semiconductor device according to claim 10, wherein the first lead and the second lead have the same shape.

18. The semiconductor device according to claim 10, wherein the first lead and the second lead are respectively connected to the die through wire bonding via at least one wire, and the wires connecting a same pair of the first lead and the second lead have the same loop height.

19. The semiconductor device according to claim 18, wherein a spacing between the wires connecting a same pair of the first lead and the second lead is not greater than five times a diameter of each of the wires.

20. The semiconductor device according to claim 10, wherein diameters of the first body and the second body are respectively 0.4 to 2 times extension lengths of the first extension portion and the second extension portion.

* * * * *